(12) United States Patent
Qian et al.

(10) Patent No.: US 9,586,304 B2
(45) Date of Patent: *Mar. 7, 2017

(54) CONTROLLED-EXPANSION CMP PAD CASTING METHOD

(71) Applicant: Rohm and Haas Electronic Materials CMP Holdings, Inc., Newark (DE)

(72) Inventors: Bainian Qian, Newark, DE (US); Andrew Wank, Avondale, PA (US); George C. Jacob, Newark, DE (US)

(73) Assignee: Rohm and Haas Electronic Materials CMP Holdings, Inc., Newark, DE (US)

( * ) Notice: Subject to any disclaimer, the term of this patent is extended or adjusted under 35 U.S.C. 154(b) by 118 days.

This patent is subject to a terminal disclaimer.

(21) Appl. No.: 14/576,927

(22) Filed: Dec. 19, 2014

(65) Prior Publication Data

US 2016/0176013 A1    Jun. 23, 2016

(51) Int. Cl.
*B24D 3/00*    (2006.01)
*B24D 11/00*   (2006.01)
(Continued)

(52) U.S. Cl.
CPC .......... *B24B 37/24* (2013.01); *C08G 18/4841* (2013.01); *C08G 18/4854* (2013.01);
(Continued)

(58) Field of Classification Search
USPC .......................................... 51/296, 293, 298
See application file for complete search history.

(56) References Cited

U.S. PATENT DOCUMENTS 5,114,982 A * 5/1992 Mendelsohn .......... C08G 18/10
                                              521/137
5,578,362 A    11/1996 Reinhardt et al.
(Continued)

OTHER PUBLICATIONS

Thomas, Transport Characteristics of Suspension: VIII. A Note on the Viscosity of Newtonian Suspensions of Uniform Sperical Particles, Journal of Colloid Science, 20, pp. 267-277 (1965).
(Continued)

*Primary Examiner* — James McDonough
(74) *Attorney, Agent, or Firm* — Blake T. Biederman

(57) ABSTRACT

The invention provides a method of manufacturing a polishing pad suitable for planarizing at least one of semiconductor, optical and magnetic substrates. The method obtains a liquid polyurethane material formed from an isocyanate-terminated molecule and a curative agent. The liquid polyurethane material has a $T_{gel}$ temperature and contains fluid-filled polymeric microspheres. The fluid-filled polymeric microspheres are a blend of preexpanded and unexpanded fluid-filled polymeric microspheres. The preexpanded and unexpanded fluid-filled polymeric microspheres each have a $T_{start}$ temperature where diameter of the preexpanded and unexpanded fluid-filled polymeric microspheres increases and a $T_{max}$ temperature where gas escapes to decrease diameter of the expanded and unexpanded fluid-filled polymeric microspheres. The cured polyurethane matrix contains preexpanded and expanded fluid-filled polymeric microspheres.

10 Claims, 6 Drawing Sheets

(51) Int. Cl.
| | |
|---|---|
| *B24D 18/00* | (2006.01) |
| *C09K 3/14* | (2006.01) |
| *B24B 1/00* | (2006.01) |
| *B24B 37/24* | (2012.01) |
| *C08L 75/04* | (2006.01) |
| *C08G 18/48* | (2006.01) |
| *C08G 18/72* | (2006.01) |
| *C08G 18/75* | (2006.01) |
| *C08G 18/76* | (2006.01) |
| *C08G 73/10* | (2006.01) |
| *C08K 7/22* | (2006.01) |
| *C08L 33/26* | (2006.01) |

(52) U.S. Cl.
CPC ......... *C08G 18/724* (2013.01); *C08G 18/758* (2013.01); *C08G 18/7621* (2013.01); *C08G 73/1007* (2013.01); *C08K 7/22* (2013.01); *C08L 33/26* (2013.01); *C08L 75/04* (2013.01)

(56) References Cited

U.S. PATENT DOCUMENTS

| | | | |
|---|---|---|---|
| 6,627,671 B1 * | 9/2003 | Kihara | ................... C08G 18/12 428/313.5 |
| 7,074,115 B2 | 7/2006 | James et al. | |
| 7,435,364 B2 | 10/2008 | James et al. | |

OTHER PUBLICATIONS

Copending U.S. Appl. No. 14/576,841.
Copending U.S. Appl. No. 14/576,896.

\* cited by examiner

CONTROLLED-EXPANSION CMP PAD CASTING METHOD

BACKGROUND

This specification relates to manufacturing polishing pads useful for polishing and planarizing semiconductor, optical and magnetic substrates.

Polyurethane polishing pads are the primary pad-type for a variety of demanding precision polishing applications. These polyurethane polishing pads are effective for polishing silicon wafers, patterned wafers, flat panel displays and magnetic storage disks. In particular, polyurethane polishing pads provide the mechanical integrity and chemical resistance for most polishing operations used to fabricate integrated circuits. For example, polyurethane polishing pads have high strength for resisting tearing; abrasion resistance for avoiding wear problems during polishing; and stability for resisting attack by strong acidic and strong caustic polishing solutions.

The production of semiconductors typically involves several chemical mechanical planarization (CMP) processes. In each CMP process, a polishing pad in combination with a polishing solution, such as an abrasive-containing polishing slurry or an abrasive-free reactive liquid, removes excess material in a manner that planarizes or maintains flatness for receipt of a subsequent layer. The stacking of these layers combines in a manner that forms an integrated circuit. The fabrication of these semiconductor devices continues to become more complex due to requirements for devices with higher operating speeds, lower leakage currents and reduced power consumption. In terms of device architecture, this translates to finer feature geometries and increased metallization levels. In some applications, these increasingly stringent device design requirements are driving the adoption of increased number of tungsten interconnect plugs or vias in conjunction with new dielectric materials having lower dielectric constants. The diminished physical properties, frequently associated with low k and ultra-low k materials, in combination with the devices' increased complexity have led to greater demands on CMP consumables, such as polishing pads and polishing solutions.

In order to maintain consistent wafer throughput, semiconductor fabricators have practiced in-situ conditioning with diamond disks for years. In-situ conditioning cuts the polishing pads top surface during polishing. A one-hundred percent in-situ conditioning process diamond-conditions during the entire polishing process. A fifty-percent in-situ conditioning process conditions over one-half the polishing process. This conditioning process is essential to roughen the polishing surface to maintain removal rate by preventing glazing of the polishing pad. In addition, these pads must polish with consistent rates over hundreds of wafers.

Casting polyurethane into cakes and cutting the cakes into several thin polishing pads has proven to be an effective method for manufacturing polishing pads with consistent reproducible polishing properties. Reinhardt et al., in U.S. Pat. No. 5,578,362, disclose the use of polymeric microspheres to improve planarization while maintaining low defectivity. Unfortunately, commercial polyurethane pads produced with this structure often have rates that are sensitive to the diamond conditioner and conditioning process. In particular, as the diamonds wear on the conditioner, they cut shallower channels into the polishing pad and these shallower channels can result in lower polishing removal rates.

In interlayer dielectric (ILD) polishing with fumed silica slurry, removal rate (RR) of a polishing pad is very sensitive to diamond conditioning. Without in-situ conditioning, the RR deteriorates rapidly within a few wafers of polishing, see FIG. 1. Although one-hundred percent in-situ conditioning is typically used in ILD polishing with a fumed silica slurry, high RR sensitivity to conditioning can still result in performance variation as a result of wear of conditioning disk over pad life. Therefore, there is a need for a polishing pad with reduced sensitivity to conditioning without sacrificing its polishing efficiency. Furthermore, there is a need to develop an effective method for manufacturing these and other CMP polishing pads.

STATEMENT OF INVENTION

An aspect of the invention provides a method of manufacturing a polishing pad suitable for planarizing at least one of semiconductor, optical and magnetic substrates, the method comprising the following: obtaining a liquid polyurethane material formed from an isocyanate-terminated molecule and a curative agent, the liquid polyurethane material having a $T_{gel}$ temperature and containing fluid-filled polymeric microspheres, the fluid-filled polymeric microspheres are a blend of preexpanded and unexpanded fluid-filled polymeric microspheres, the preexpanded and unexpanded fluid-filled polymeric microspheres each having a $T_{start}$ temperature where diameter of the preexpanded and unexpanded fluid-filled polymeric microspheres increases at temperatures equal to or above the $T_{start}$ temperature, and a $T_{max}$ temperature where gas escapes through the preexpanded and unexpanded fluid-filled polymeric microspheres to decrease diameter of the expanded and unexpanded fluid-filled polymeric microspheres, with the $T_{start}$ temperature of the unexpanded fluid-filled polymeric microspheres being less than the $T_{gel}$ temperature of the liquid polyurethane material; casting the liquid polyurethane material containing the blend of preexpanded and unexpanded fluid-filled polymeric microspheres to react the isocyanate-terminated molecule and the curative agent; heating the blend of preexpanded and unexpanded fluid-filled polymeric microspheres in the liquid polyurethane material to a temperature of at least $T_{start}$ of the unexpanded fluid-filled polymeric microspheres to increase the diameter of the unexpanded fluid-filled polymeric microspheres, the heating being to a temperature less than the $T_{max}$ temperature where gas escapes through the preexpanded and unexpanded fluid-filled polymeric microspheres, the heating being to form a blend of preexpanded and expanded fluid-filled polymeric microspheres in the liquid polyurethane material; curing the blend of preexpanded and expanded fluid-filled polymeric microspheres in the liquid polyurethane material to solidify the liquid polyurethane material into a polyurethane matrix containing the preexpanded and expanded fluid-filled polymeric microspheres; and finishing the polishing pad from the cured polyurethane matrix containing the preexpanded and expanded fluid-filled polymeric microspheres wherein final diameter of the preexpanded and expanded fluid-filled polymeric microspheres is less than that achieved from the $T_{max}$ temperature in air and a majority of fluid contained in the preexpanded and unexpanded fluid-filled polymeric microspheres remains in the preexpanded and expanded fluid-filled polymeric microspheres.

Another aspect of the invention provides a method of manufacturing a polishing pad suitable for planarizing at least one of semiconductor, optical and magnetic substrates, the method comprising the following: obtaining a liquid polyurethane material formed from an isocyanate-terminated molecule and a curative agent, the liquid polyurethane material having a $T_{gel}$ temperature and containing fluid-filled polymeric microspheres, the fluid-filled polymeric microspheres are a blend of preexpanded and unexpanded fluid-filled polymeric microspheres filled with isobutane, isopentane or a mixture of isobutane and isopentane, the preexpanded and unexpanded fluid-filled polymeric microspheres each having a $T_{start}$ temperature where diameter of the preexpanded and unexpanded fluid-filled polymeric microspheres increases at temperatures equal to or above the $T_{start}$ temperature, and a $T_{max}$ temperature where gas escapes through the preexpanded and unexpanded fluid-filled polymeric microspheres to decrease diameter of the expanded and unexpanded fluid-filled polymeric microspheres, with the $T_{start}$ temperature of the unexpanded fluid-filled polymeric microspheres being less than the $T_{gel}$ temperature of the liquid polyurethane material; casting the liquid polyurethane material containing the blend of preexpanded and unexpanded fluid-filled polymeric microspheres to react the isocyanate-terminated molecule and the curative agent; heating the blend of preexpanded and unexpanded fluid-filled polymeric microspheres in the liquid polyurethane material to a temperature of at least $T_{start}$ of the unexpanded fluid-filled polymeric microspheres to increase the diameter of the unexpanded fluid-filled polymeric microspheres, the heating being to a temperature less than the $T_{max}$ temperature where gas escapes through the preexpanded and unexpanded fluid-filled polymeric microspheres, the heating being to form a blend of preexpanded and expanded fluid-filled polymeric microspheres in the liquid polyurethane material; curing the blend of preexpanded and expanded fluid-filled polymeric microspheres in the liquid polyurethane material to solidify the liquid polyurethane material into a polyurethane matrix containing the preexpanded and expanded fluid-filled polymeric microspheres; and finishing the polishing pad from the cured polyurethane matrix containing the preexpanded and expanded fluid-filled polymeric microspheres wherein final diameter of the preexpanded and expanded fluid-filled polymeric microspheres is less than that achieved from the $T_{max}$ temperature in air and a majority of fluid contained in the preexpanded and unexpanded fluid-filled polymeric microspheres remains in the preexpanded and expanded fluid-filled polymeric microspheres.

DETAILED DESCRIPTION

Figure 1:
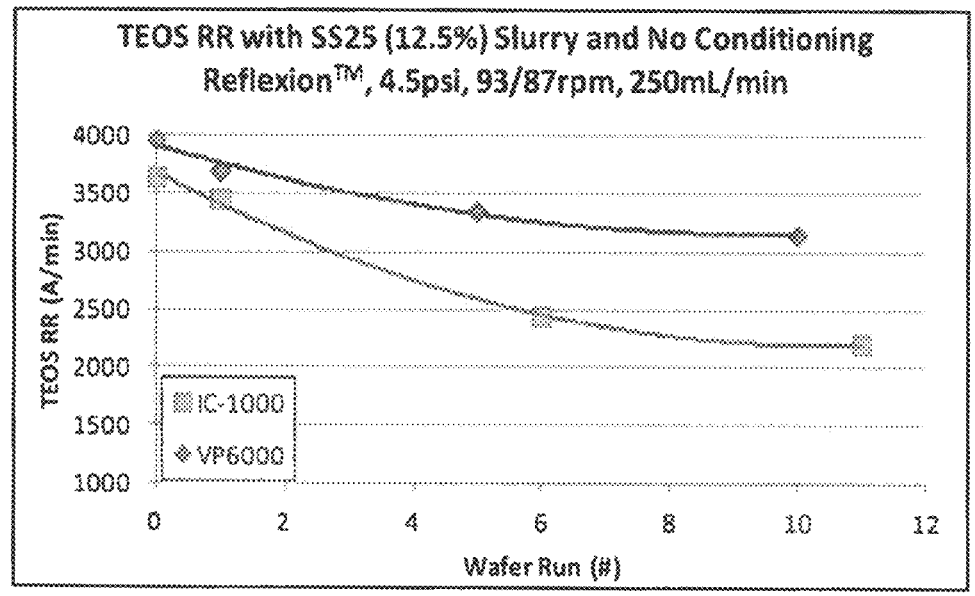
FIG. 1 is a plot of removal rate in Å/min versus wafer number after stopping in-situ conditioning for Semi-Sperse™ 25E (SS25) fumed silica slurry. (Semi-Sperse is a trademark of Cabot Microelectronics Corporation.)

The invention provides a polishing pad suitable for planarizing at least one of semiconductor, optical and magnetic substrates. The polishing pad has a top polishing surface, comprising a reaction product of an isocyanate-terminated prepolymer and a curative system. The top polishing layer further comprises polymeric microspheres at a level between above 4 and less than 8 weight percent of the prepolymer. These polishing pads have higher removal rate, better within wafer uniformity, and reduced sensitivity to conditioning process.

The polishing pad contains 4.2 to 7.5 weight percent fluid-filled microspheres in the prepolymer. Preferably, the polishing pad contains 4.5 to 7.5 weight percent fluid-filled microspheres in the prepolymer. Most preferably, the polishing pad contains 5 to 7.5 weight percent fluid-filled microspheres in the prepolymer. This leads to a low density or high porosity polishing pad with controlled pore size. For example, the final density may be 0.5 to 0.75 g/cm$^3$. Preferably, the final density is 0.5 to 0.65 g/cm$^3$.

The fluid filling the microspheres can be a gas, liquid or a combination of gas and liquid. If the fluid is a liquid, then the preferred fluid is water, such as distilled water that only contains incidental impurities. For purposes of this application the term microsphere includes shells with less than a perfect spherical shape; for example, these shells have what appears to be a semi-hemispherical shape when cut open and viewed with an SEM. If the fluid is a gas, then air, nitrogen, argon, carbon dioxide or combination thereof is preferred. For some microspheres, the gas may be an organic gas, such as isobutane. Preferably, the fluid is isobutane, isopentane or a combination of isobutane and isopentane. Isobutane trapped in the polymeric microsphere is gas at room temperature (25° C.) and above, depending upon internal pressure in the polymeric shell. Isopentane trapped in the polymeric microsphere is a combination of liquid and gas at room temperature. At temperatures of about 30° C. and above, the isopentane becomes gas—depending upon internal pressure in the polymeric shell. A polymeric shell holds the fluid; and typically the polymeric shell holds gas under pressure. Specific examples of the polymer shell include polyacrylonitrile/methacrylonitrile shells and poly(vinylidene dichloride)/polyacrylonitrile shells. Furthermore, these shells may incorporate inorganic particles, such as silicates, calcium-containing or magnesium-containing particles. These particles facilitate separation of the polymeric microspheres. These fluid-filled-microspheres typically have an average final average diameter of 10 to 80 μm after expansion and preferably, 20 to 60 μm. Preexpanded polymeric microspheres typically grow 10 to 60 percent to a final average diameter of 20 to 150 μm. Unexpanded polymeric microspheres, however, typically grow 1,000 to 10,000 percent to a final diameter of 20 to 150 μm. The resulting blend of polymeric microspheres in the solidified polymeric matrix has a final average diameter of 10 to 80 μm after expansion and preferably, 20 to 60 μm.

The polishing pad optionally contains silica-containing or alkaline earth (Group IIA of the Periodic Table) metal oxide-containing regions distributed within each of the polymeric microspheres. These silica-containing or alkaline earth metal oxide-containing regions may be particles or have an elongated alkaline earth metal oxide-containing structure. Typically, the alkaline earth metal oxide-containing regions represent particles embedded or attached to the polymeric microspheres. The average particle size of the alkaline earth metal oxide-containing particles is typically 0.01 to 3 μm. Preferably, the average particle size of the alkaline earth metal oxide-containing particles is 0.01 to 2 μm. These alkaline earth metal oxide-containing particles are spaced to coat less than 50 percent of the outer surface of the polymeric microspheres. Preferably, the alkaline earth metal oxide-containing regions cover 1 to 40 percent of the surface area of the polymeric microspheres. Most preferably, the alkaline earth metal oxide-containing regions cover 2 to 30 percent of the surface area of the polymeric microspheres. The silica-containing or alkaline earth metal oxide-containing microspheres have a density of 5 g/liter to 1,000 g/liter. Typically, the alkaline earth metal oxide-containing microspheres have a density of 10 g/liter to 1,000 g/liter.

Typical polymeric polishing pad matrix materials include polycarbonate, polysulfone, polyamides, ethylene copolymers, polyethers, polyesters, polyether-polyester copolymers, acrylic polymers, polymethyl methacrylate, polyvinyl chloride, polyethylene copolymers, polybutadiene, polyethylene imine, polyurethanes, polyether sulfone, polyether imide, polyketones, epoxies, silicones, copolymers thereof and mixtures thereof. Preferably, the polymeric material is a polyurethane; and may be either a cross-linked or a non-cross-linked polyurethane. For purposes of this specification, "polyurethanes" are products derived from difunctional or polyfunctional isocyanates, e.g. polyetherureas, polyisocyanurates, polyurethanes, polyureas, palyurethaneureas, copolymers thereof and mixtures thereof.

Preferably, the polymeric material is a block or segmented copolymer capable of separating into phases rich in one or more blocks or segments of the copolymer. Most preferably, the polymeric material is a polyurethane. Cast polyurethane matrix materials are particularly suitable for planarizing semiconductor, optical and magnetic substrates. An approach for controlling a pad's polishing properties is to alter its chemical composition. In addition, the choice of raw materials and manufacturing process affects the polymer morphology and the final properties of the material used to make polishing pads.

Preferably, urethane production involves the preparation of an isocyanate-terminated urethane prepolymer from a polyfunctional aromatic isocyanate and a prepolymer polyol. For purposes of this specification, the term prepolymer polyol includes diols, polyols, polyol-diols, copolymers thereof and mixtures thereof. Preferably, the prepolymer polyol is selected from the group comprising polytetramethylene ether glycol [PTMEG], polypropylene ether glycol [PPG], ester-based polyols, such as ethylene or butylene adipates, copolymers thereof and mixtures thereof. Example polyfunctional aromatic isocyanates include 2,4-toluene diisocyanate, 2,6-toluene diisocyanate, 4,4'-diphenylmethane diisocyanate, naphthalene-1,5-diisocyanate, tolidine diisocyanate, para-phenylene diisocyanate, xylylene diisocyanate and mixtures thereof. The polyfunctional aromatic isocyanate contains less than 20 weight percent aliphatic isocyanates, such as 4,4'-dicyclohexylmethane diisocyanate, isophorone diisocyanate and cyclohexanediisocyanate. Preferably, the polyfunctional aromatic isocyanate contains less than 15 weight percent aliphatic isocyanates and more preferably, less than 12 weight percent aliphatic isocyanate.

Example prepolymer polyols include polyether polyols, such as, poly(oxytetramethylene)glycol, poly(oxypropylene)glycol and mixtures thereof, polycarbonate polyols, polyester polyols, polycaprolactone polyols and mixtures thereof. Example polyols can be mixed with low molecular weight polyols, including ethylene glycol, 1,2-propylene glycol, 1,3-propylene glycol, 1,2-butanediol, 1,3-butanediol, 2-methyl-1, 3-propanediol, 1,4-butanediol, neopentyl glycol, 1,5-pentanediol, 3-methyl-1,5-pentanediol, 1,6-hexanediol, diethylene glycol, dipropylene glycol, tripropylene glycol and mixtures thereof.

Preferably the prepolymer polyol is selected from the group comprising polytetramethylene ether glycol, polyester polyols, polypropylene ether glycols, polycaprolactone polyols, copolymers thereof and mixtures thereof. If the prepolymer polyol is PTMEG, copolymer thereof or a mixture thereof, then the isocyanate-terminated reaction product preferably has a weight percent unreacted NCO range of 8.0 to 20.0 weight percent. For polyurethanes formed with PTMEG or PTMEG blended with PPG, the preferable weight percent NCO is a range of 8.75 to 12.0; and most preferably it is 8.75 to 10.0. Particular examples of PTMEG family polyols are as follows: Terathane® 2900, 2000, 1800, 1400, 1000, 650 and 250 from Invista; Polymeg® 2900, 2000, 1000, 650 from Lyondell; Poly-THF® 650, 1000, 2000 from BASF, and lower molecular weight species such as 1,2-butanediol, 1,3-butanediol, and 1,4-butanediol. If the prepolymer polyol is a PPG, copolymer thereof or a mixture thereof, then the isocyanate-terminated reaction product most preferably has a weight percent unreacted NCO range of 7.9 to 15.0 wt. %. Particular examples of PPG polyols are as follows: Arcol® PPG-425, 725, 1000, 1025, 2000, 2025, 3025 and 4000 from Bayer; Voranol® 1010L, 2000L, and P400 from Dow; Desmophen® 1110BD, Acclaim® Polyol 12200, 8200, 6300, 4200, 2200 both product lines from Bayer. If the prepolymer polyol is an ester, copolymer thereof or a mixture thereof, then the isocyanate-terminated reaction product most preferably has a weight percent unreacted NCO range of 6.5 to 13.0. Particular examples of ester polyols are as follows: Millester 1, 11, 2, 23, 132, 231, 272, 4, 5, 510, 51, 7, 8, 9, 10, 16, 253, from Polyurethane Specialties Company, Inc.; Desmophen® 1700, 1800, 2000, 2001KS, 2001K2, 2500, 2501, 2505, 2601, PE65B from Bayer; Rucoflex S-1021-70, S-1043-46, S-1043-55 from Bayer.

Typically, the prepolymer reaction product is reacted or cured with a curative polyol, polyamine, alcohol amine or mixture thereof. For purposes of this specification, polyamines include diamines and other multifunctional amines. Example curative polyamines include aromatic diamines or polyamines, such as, 4,4'-methylene-bis-o-chloroaniline [MbOCA], 4,4'-methylene-bis-(3-chloro-2,6-diethylaniline) [MCDEA]; dimethylthiotoluenediamine; trimethyleneglycol di-p-aminobenzoate; polytetramethyleneoxide di-p-aminobenzoate; polytetramethyleneoxide mono-p-aminobenzoate; polypropyleneoxide di-p-aminobenzoate; polypropyleneoxide mono-p-aminobenzoate; 1,2-bis(2-aminophenylthio)ethane; 4,4'-methylene-bis-aniline; diethyltoluenediamine; 5-tert-butyl-2,4- and 3-tert-butyl-2,6-toluenediamine; 5-tert-amyl-2,4- and 3-tert-amyl-2,6-toluenediamine and chlorotoluenediamine. Optionally, it is possible to manufacture urethane polymers for polishing pads with a single mixing step that avoids the use of prepolymers.

The components of the polymer used to make the polishing pad are preferably chosen so that the resulting pad morphology is stable and easily reproducible. For example, when mixing 4,4'-methylene-bis-o-chloroaniline [MbOCA] with diisocyanate to form polyurethane polymers, it is often advantageous to control levels of monoamine, diamine and triamine. Controlling the proportion of mono-, di- and triamines contributes to maintaining the chemical ratio and resulting polymer molecular weight within a consistent range. In addition, it is often important to control additives such as anti-oxidizing agents, and impurities such as water for consistent manufacturing. For example, since water reacts with isocyanate to form gaseous carbon dioxide, controlling the water concentration can affect the concentration of carbon dioxide bubbles that form pores in the polymeric matrix. Isocyanate reaction with adventitious water also reduces the available isocyanate for reacting with chain extender, so changes the stoichiometry along with level of crosslinking (if there is an excess of isocyanate groups) and resulting polymer molecular weight.

The polyurethane polymeric material is preferably formed from a prepolymer reaction product of toluene diisocyanate and polytetramethylene ether glycol with an aromatic diamine. Most preferably the aromatic diamine is 4,4'-methylene-bis-o-chloroaniline or 4,4'-methylene-bis-(3-chloro-2,6-diethylaniline). Preferably, the prepolymer reaction product has a 6.5 to 15.0 weight percent unreacted NCO. Examples of suitable prepolymers within this unreacted NCO range include: Imuthane® prepolymers PET-70D, PHP-70D, PET-75D, PHP-75D, PPT-75D, PHP-80D manufactured by COIM USA, Inc. and Adiprene® prepolymers, LFG740D, LF700D, LF750D, LF751D, LF753D, L325 manufactured by Chemtura. In addition, blends of other prepolymers besides those listed above could be used to reach to appropriate percent unreacted NCO levels as a result of blending. Many of the above-listed prepolymers, such as, LFG740D, LF700D, LF750D, LF751 D, and LF753D are low-free isocyanate prepolymers that have less than 0.1 weight percent free TDI monomer and have a more consistent prepolymer molecular weight distribution than conventional prepolymers, and so facilitate forming polishing pads with excellent polishing characteristics. This improved prepolymer molecular weight consistency and low free isocyanate monomer give a more regular polymer structure, and contribute to improved polishing pad consistency. For most prepolymers, the low free isocyanate monomer is preferably below 0.5 weight percent. Furthermore, "conventional" prepolymers that typically have higher levels of reaction (i.e. more than one polyol capped by a diisocyanate on each end) and higher levels of free toluene diisocyanate prepolymer should produce similar results. In addition, low molecular weight polyol additives, such as, diethylene glycol, butanediol and tripropylene glycol facilitate control of the prepolymer reaction product's weight percent unreacted NCO.

Similarly, the polyurethane polymeric material may be formed from a prepolymer reaction product of 4, 4'-diphenylmethane diisocyanate (MDI) and polytetramethylene glycol with a diol. Most preferably, the diol is 1, 4-butanediol (BDO). Preferably, the prepolymer reaction product has 6 to 13 wt % unreacted NCO. Examples of suitable polymers with this unreacted NCO range include the following: Imuthane 27-85A, 27-90A, 27-95A, 27-52D, 27-58D from COIM USA and Andur® IE-75AP, IE80AP, IE90AP, IE98AP, IE110AP prepolymers from Anderson Development Company.

In addition to controlling weight percent unreacted NCO, the curative and prepolymer reaction product typically has an OH or NH2 to unreacted NCO stoichiometric ratio of 85 to 115 percent, preferably 90 to 100 percent. This stoichiometry could be achieved either directly, by providing the stoichiometric levels of the raw materials, or indirectly by reacting some of the NCO with water either purposely or by exposure to adventitious moisture.

The polishing pad has less sensitivity to conditioner wear than most polishing pads. This is particularly useful for combating the adverse impact of diamond wear. Pads of the invention can have a conditioner sensitivity (CS) of 0 to 2.6. Preferably the CS is 0 to 2. For purpose of this application, CS is defined as follows:

$$CS = \frac{|RR_{75\% \text{ In-situ Conditioning}} - RR_{50\% \text{ In-situ Conditioning}}|}{RR_{50\% \text{ In-situ Conditioning}}} \times 100\% \quad \text{(Equation 1)}$$

where CS is defined as blanket TEOS removal rate at 75% in-situ conditioning ($RR_{75\% \text{ In-situ Conditioning}}$) and blanket TEOS removal rate at 50% in-situ conditioning ($RR_{50\% \text{ In-situ Conditioning}}$) and the difference between the 75% in-situ conditioning and the 50% in-situ conditioning is divided by the blanket TEOS removal rate at 50% partial in-situ conditioning using a fumed silica slurry having a 0.1 μm average particle size at a 12.5 wt % concentration with a pH of 10.5 (all after being diluted with distilled water at a 1:1 ratio) with a diamond conditioner with a 150 μm average particle size, a 400 μm pitch and a 100 μm protrusion at a conditioner downforce of 9 lbs (or 4.08 Kg). The CS removal rate values represent the removal rate achieved after reaching steady state polishing Or typically at least after about ten wafers.

There are significant challenges in making CMP polishing pads with preexpanded polymeric microspheres at level above 4 weight percent in prepolymer, due to exponential increase of material viscosity with increasing loading of preexpanded polymeric microspheres. The introduction of unexpanded polymeric microspheres that can expand from the reaction exotherm of the prepolymer and the curative system not only reduced material viscosity for easy processing, but also resulted in better product consistency and higher production yield.

During production, a liquid polyurethane material has a $T_{gel}$ temperature and contains fluid-filled polymeric microspheres. The fluid-filled polymeric microspheres are a blend of preexpanded and unexpanded fluid-filled polymeric microspheres. The preexpanded and unexpanded fluid-filled polymeric microspheres each have a $T_{start}$ temperature where diameter of the preexpanded and unexpanded fluid-filled polymeric microspheres increases at temperatures equal to or above the $T_{start}$ temperature. In addition, they have a $T_{max}$ temperature where gas escapes through the fluid-filled polymeric microspheres to decrease diameter of polymeric microspheres. Because this can form large gas bubbles in the polymer matrix and large bubbles can result in polishing defects, casting at or above the $T_{max}$ temperature is not a desireable situation. In order to grow the unexpanded polymeric microspheres, it is important that the $T_{start}$ temperature of the unexpanded fluid-filled polymeric microspheres be less than the $T_{gel}$ temperature of the liquid polyurethane material. Advantageously, the $T_{start}$ temperature of the unexpanded fluid-filled polymeric microspheres is at least 5° C. less than the $T_{gel}$ temperature of the liquid polyurethane material. Advantageously, the $T_{start}$ temperature of the unexpanded fluid-filled polymeric microspheres is at least 10° C. less than the $T_{gel}$ temperature of the liquid polyurethane material. As the preexpanded already have an effective average diameter, there is no need for further growth and it is optional for the $T_{start}$ temperature of the preexpanded fluid-filled polymeric microspheres be less than the $T_{gel}$ temperature of the liquid polyurethane material.

Then casting the liquid polyurethane material containing the blend of preexpanded and unexpanded fluid-filled polymeric microspheres reacts the isocyanate-terminated molecule and the curative agent. Exothermic heat from the reaction, heats the blend of preexpanded and unexpanded fluid-filled polymeric microspheres in the liquid polyurethane material to a temperature of at least $T_{start}$ of the unexpanded fluid-filled polymeric microspheres to increase the diameter of the unexpanded fluid-filled polymeric microspheres. Preferably this exothermic heat is the primary heat source to drive expansion to the polymeric microspheres. The heating is to a temperature less than the $T_{max}$ temperature where gas escapes through the preexpanded and unexpanded fluid-filled polymeric microspheres. This heating forms a blend of preexpanded and expanded fluid-filled polymeric microspheres in the liquid polyurethane material. Optionally, mixing the blend of preexpanded and unexpanded polymeric microspheres in the liquid polyurethane material before casting improves uniformity of the polymeric microsphere distribution.

Curing the blend of preexpanded and expanded fluid-filled polymeric microspheres in the liquid polyurethane material solidifies the liquid polyurethane material into a polyurethane matrix containing the preexpanded and expanded fluid-filled polymeric microspheres. Then finishing the cured polyurethane matrix containing the preexpanded and expanded fluid-filled polymeric microspheres into a polishing pad by skiving, facing, grooving, perforating and adding a subpad creates a finished product. For example, when casting into a mold, it is possible to skive the polishing pad into multiple polyurethane sheets, then form the polishing pads from the polyurethane sheets. The final diameter of the preexpanded and expanded fluid-filled polymeric microspheres in the polishing pad is less than that achieved from the $T_{max}$ temperature in air and a majority of fluid contained in the preexpanded and unexpanded fluid-filled polymeric microspheres remains in the preexpanded and expanded fluid-filled polymeric microspheres.

In addition, it is important that the liquid polyurethane material has low viscosity to facilitate casting into consistent product configurations. Forming a blend of preexpanded and unexpanded polymeric microspheres lowers viscosity to facilitate casting. This is of particular importance when casting around objects such as transparent blocks used to form transparent windows in the polishing pads. A preexpanded only mixture can lack the viscosity required for pouring into simple shapes. An unexpanded only mixture can create significant stress in a cake from large expansion of unexpanded microspheres. These stresses can result in a cracked or fractured polymeric matrix. Furthermore, it is advantageous that the majority of the heat required to expand the unexpanded polymeric microspheres arises from an exothermic reaction used to create the polymeric matrix. A blend of preexpanded and unexpanded polymeric microspheres having a relative viscosity of 1.1 to 7, however, can have sufficient viscosity for casting in combination with sufficient exothermic heat to create adequate porosity. Preferably, a relative viscosity of 3 to 7 provides a balanced combination of castability and pore size. Furthermore, increasing the proportion of unexpanded to preexpanded polymeric microspheres decreases viscosity to improve the castability, but increases the residual stress in the cake that can cause cake pop and other defects. Similarly, increasing the proportion of preexpanded to unexpanded polymeric microspheres can increase the viscosity to render casting more difficult.

EXAMPLES

Example 1

Table 1 lists composition of the polishing layer of two comparative examples #C1 and #C2 and two examples from the present invention #1 and #2. The isocyanate-terminated prepolymer used was Adiprene® L325, commercially available from Chemtura Corporation, with typical unreacted isocyanate (NCO) of 9.1% by weight. The curative system was either 4,4'-methylene-bis(2-chloroaniline) (MbOCA) or a combination of MbOCA and Voralux® HF 505, a high molecular weight (MW) multi-functional polyol curative with six hydroxyl functionalities and a MW about 11,000. The reaction stoichiometry, calculated by mol ratio of total active hydrogen (as amine and hydroxyl functional groups in the curative system) to isocyanate functional groups in the prepolymer, was 0.87 for all examples. Fluid-filled polymeric microspheres, both preexpanded (DE) and dry unexpanded (DU), were mixed with the prepolymer forming a preblend. Expancel® 551DE40d42, Expancel® 461DE20d70, both DE grades, and Expancel® 031DU40, a DU grade, are commercially available from AkzoNobel. The amount of total polymeric microspheres varied from 2.2 to 5.25 weight percent in the preblend (the mixture of the prepolymer and the polymeric microspheres).

TABLE 1

| Example | MbOCA Curative (wt %) | Multi-Functional Curative (wt %) | Microsphere Diameter Preexpanded (µm) | Microsphere Preexpanded (wt %) | Microsphere Diameter Unexpanded (µm post-expansion) | Microsphere Unexpanded (wt %) | Microsphere Total (wt %) |
|---|---|---|---|---|---|---|---|
| C1 | 100 |  | 40* | 2.2 |  |  | 2.2 |
| C2 | 75 | 25 | 20** | 3.75 |  |  | 3.75 |
| 1 | 100 |  | 20** | 3.75 | 40*** | 1.5 | 5.25 |
| 2 | 75 | 25 | 20** | 3.75 | 40*** | 1.5 | 5.25 |

Adiprene ® is a urethane prepolymer products of Chemtura Corporation.
Adiprene L325 is a urethane prepolymer of H₁₂MDI/TDI with polytetramethylene ether glycol (PTMEG) having an unreacted NCO of 8.95 to 9.25 wt %.
*551DE40d42, 461DE20d70, and *031DE40 551DE40d42, 461DE20d70, and 031DE40 are fluid-filled polymeric microspheres made by AkzoNobel with tradename Expancel ®.

The polishing layer for all pad examples was finished with circular (1010) and radial (R32) overlaid grooves (1010+R32). A 1.02 mm (40 mil) thick Suba™ IV subpad was stacked to the polishing layer. The circular 1010 grooves had a width of 0.51 mm (20 mils), depth of 0.76 mm (30 mils) and a pitch of 3.05 mm (120 mils). The R-32 radial grooves were 32 evenly spaced radial grooves with a width of 0.76 mm (30 mils) and a depth of 0.81 mm (32 mils).

The slurry used was a fumed silica based ILD3225 slurry, commercially available from Nitta Haas Incorporated, having an average particle size about 0.1 μm, diluted with de-ionized water at 1:1 ratio to 12.5 wt % abrasive at the point of use (POU) for polishing. The polishing was carried out on a 300 mm CMP polishing system Reflexion® by Applied Materials. Polishing conditions are summarized below.

Polishing Conditions:
 Slurry: ILD3225 (1:1 dilution with DI water to 12.5% abrasive content; pH 10.5)
 POU filter: Pall 1.5 μm
 Slurry flow rate: 250 ml/min
 Conditioner: PDA33A-3 by Kinik Company: 150 μm diamond size, 400 μm diamond pitch, 100±15 μm diamond protrusion.
 Pad break-in: 90/108 rpm (platen/conditioning disk), 12 lbs (5.4 Kg) for 20 minutes followed by 9 lbs (4.1 Kg) downforce for 10 minutes; high pressure rise (HPR)
 During polishing: full in-situ conditioning at 9 lbs (4.1 Kg) conditioning downforce
 Polishing: 93/87 rpm (platen/wafer), at 4.5 psi (31 KPa) downforce for 60 seconds Oxide polishing was performed on TEOS oxide wafers formed by chemical vapor deposition (TEOS represents the decomposition product of tetraethyl orthosilicate). Removal rates and within-wafer non-uniformity (WIW-NU) are shown in FIG. 2 and also summarized in Table 2.

TABLE 2

| Polishing layer of Ex. # | Total Polymeric Microspheres wt % | TEOS RR (Å/min) | Within Wafer Non-Uniformity % | Normalized RR |
|---|---|---|---|---|
| C1 | 2.2 | 4546 | 3.5 | 100% |
| C2 | 3.75 | 4685 | 2.8 | 103% |
| 1 | 5.25 | 5002 | 2.6 | 110% |
| 2 | 5.25 | 5066 | 2.5 | 111% |

Figure 2:
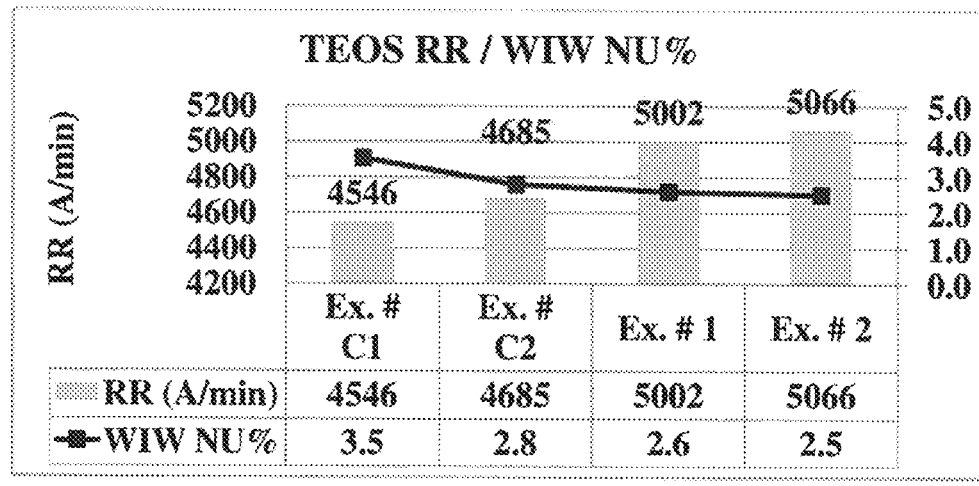
FIG. 2 is a plot of average removal rate in Å/min and within-wafer non-uniformity (WIW-NU) (%) for ILD polishing.

FIG. 2 and Table 2 illustrate improved removal rate and WIW-NU for the polishing pad of the invention.

Polishing pads from the current invention (Ex. #1 and #2), which contained more than 4 wt % of total polymeric microspheres in the preblend, demonstrated higher TEOS removal rate, better within wafer uniformity, than the comparative examples (Ex. #C1 and C2) which had less than 4 wt % of total polymeric microspheres in the preblend. Surprisingly, polishing pads from the current invention had less sensitivity to conditioning process in combination with high polishing efficiency. Conditioning sensibility (CS) is defined as RR difference at 75% and 50% partial in-situ conditioning divided by the RR at 50% partial in-situ conditioning.

$$CS = \frac{|RR_{75\% \text{ In-situ Conditioning}} - RR_{50\% \text{ In-situ Conditioning}}|}{RR_{50\% \text{ In-situ Conditioning}}} \times 100\% \quad \text{(Equation 1)}$$

As shown in Table 3, polishing pads from the current invention had CS less than 1% while comparative example #C1 had more than 3% CS. The reduced CS is critical for stable polishing performance as conditioning disks wear out over pad life.

TABLE 3

| Polishing layer of | Total Polymeric Microspheres wt % | TEOS RRA (Å/min) 75% partial in-situ | TEOS RRA (Å/min) 50% partial in-situ | Conditioning Sensibility (CS) |
|---|---|---|---|---|
| Ex. # C1 | 2.2 | 3890 | 3754 | 3.6% |
| Ex. # 1 | 5.25 | 4864 | 4821 | 0.9% |
| Ex. # 2 | 5.25 | 4961 | 4970 | 0.2% |

Figure 3:
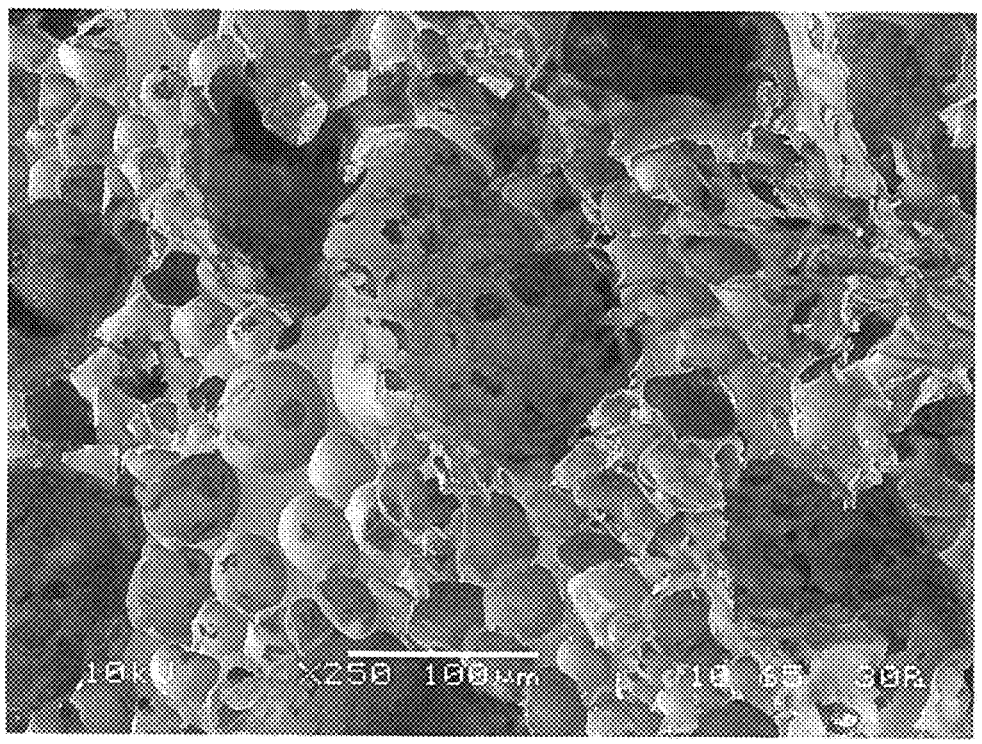
FIG. 3 is an SEM of preexpanded and unexpanded fluid-filled microspheres at a concentration of 8 wt %.

Too much fluid-filled polymeric microspheres in the preblend could result in blown-out holes in the polishing layer, leading to non-uniform product and possibly inconsistent polishing performance. FIG. 3 shows blow-out holes present at 8 wt % fluid-filled polymeric microspheres. The sample in FIG. 3 had the same chemical composition (prepolymer and curative) as comparative Ex. #C1 and Ex. #1 as shown in Table 1, but higher loading of fluid-filled polymeric microspheres at 8 wt % of Expancel 031DU40.

Figure 4:
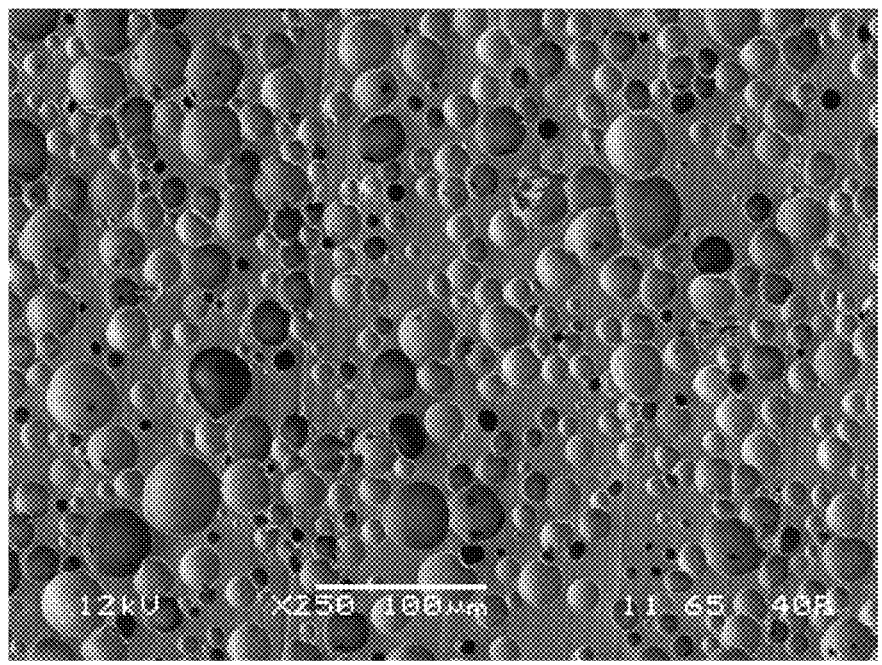
FIG. 4 is an SEM of preexpanded and unexpanded fluid-filled microspheres at a concentration of 5.25 wt % formed with an MbOCA curative.
Figure 4A:
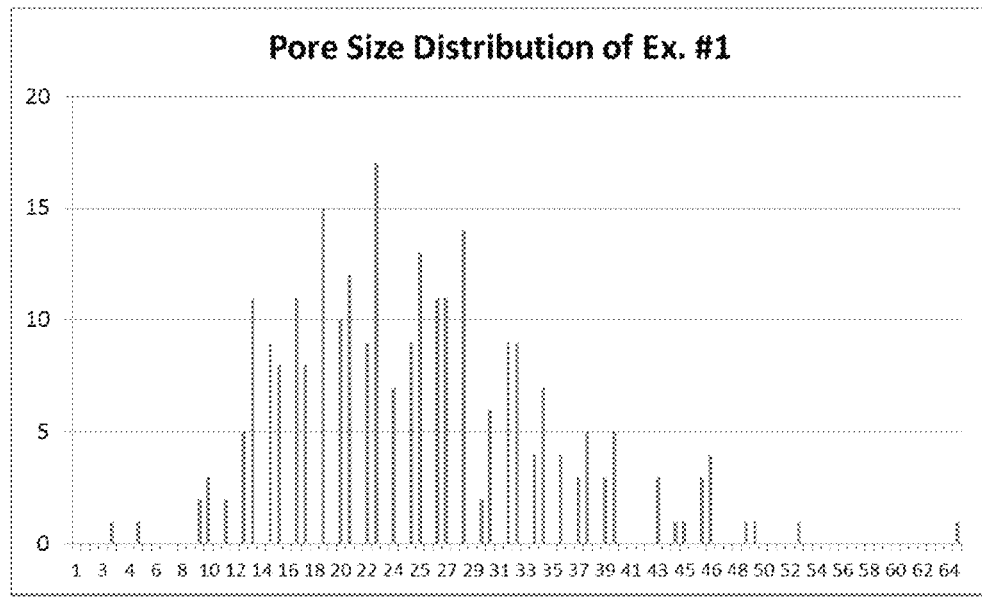
FIG. 4A is a size distribution plot of diameter measured in micrometers for the polishing pad of FIG. 4.
Figure 5:
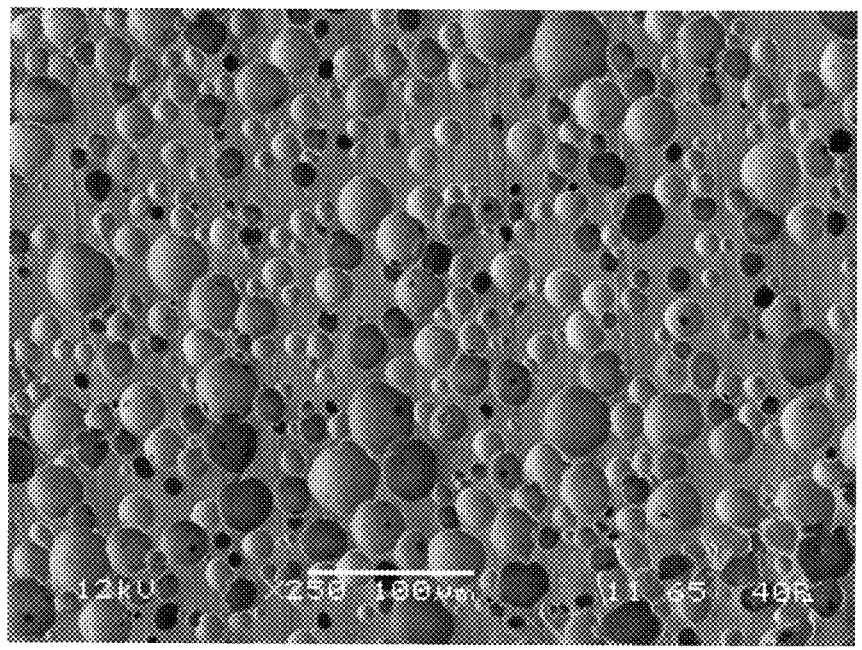
FIG. 5 is an SEM of preexpanded and unexpanded fluid-filled microspheres at a concentration of 5.25 wt % formed with an MbOCA curative blended with a multifunctional polyol.
Figure 5A:
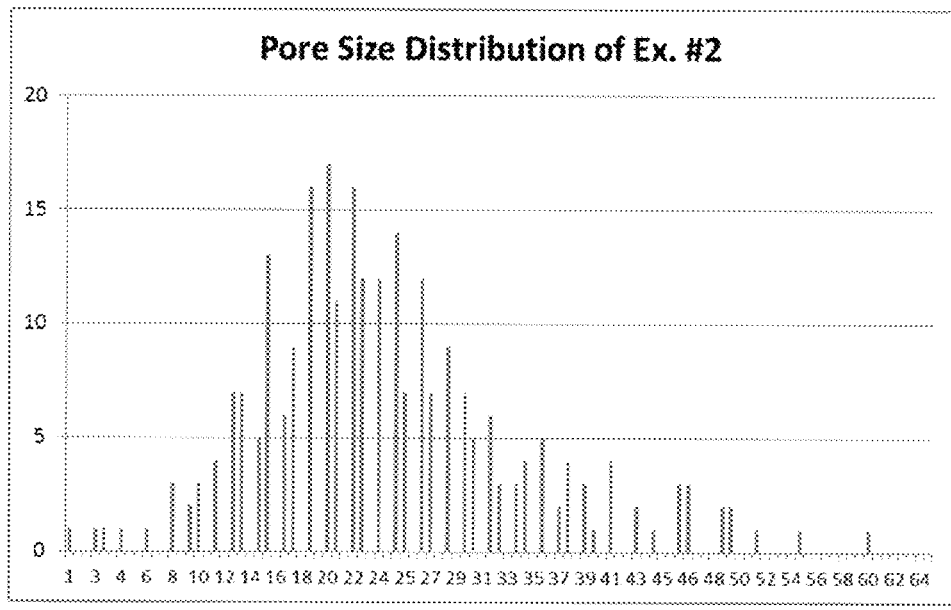
FIG. 5A is a size distribution plot of diameter measured in micrometers for the polishing pad of FIG. 5.

By comparison, both examples Ex. #1 and #2 from the current invention showed uniform pore structure in the polishing layer with normal pore size distribution, as shown in FIGS. 4 and 5, respectively.

Example 2

There have been significant challenges in casting high porosity (low SG) polymeric microsphere-filled polyurethane polishing pads in cake molds. The challenge became acerbated when an integral window was attempted. This was mainly due to poor flowability of a very viscous preblend and the liquid polyurethane precursor.

Figure 6:
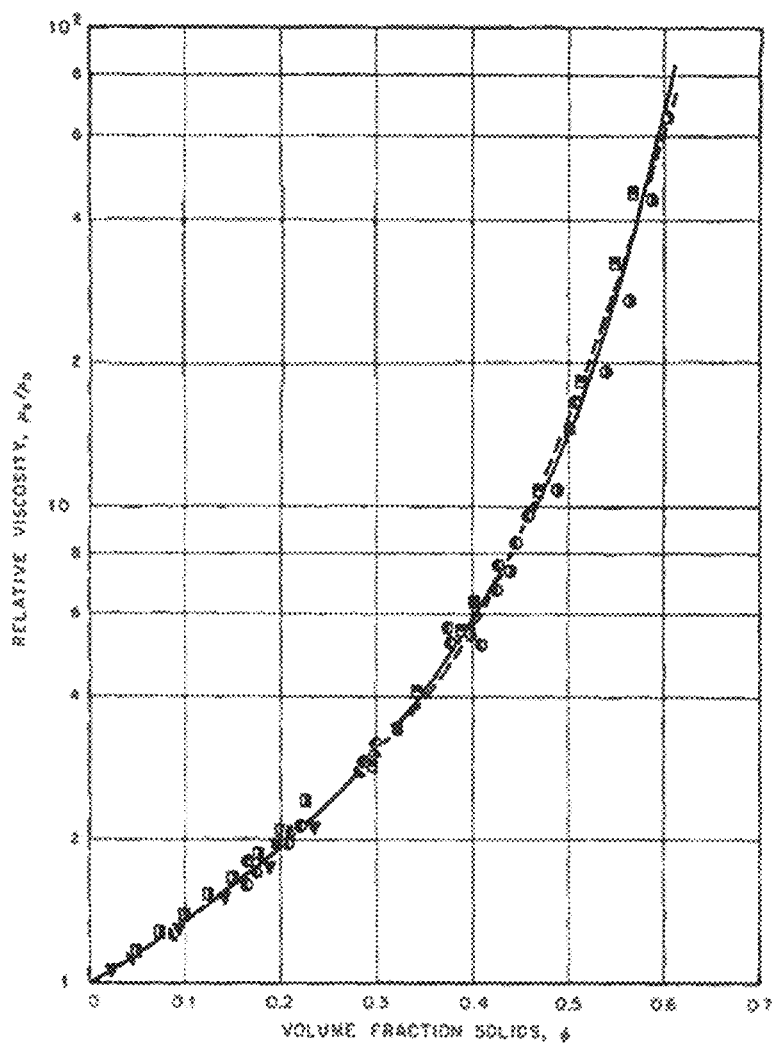
FIG. 6 is a plot of relative viscosity versus volume fraction solids according to a modified Einstein-Guth-Gold equation.

The viscosity of a filled system increases dramatically with the increase of the volume fraction of a filler, see FIG. 6 (Journal of Colloid Science, vol. 20, 267-277, 1965). David G. Thomas plotted relative viscosity of a filled system with filler volume fraction Φ and came up with the following equation to predict viscosity of a filled system. FIG. 6 plots a modified Einstein-Guth-Gold equation that describes viscosity of a suspension filled with spherical particles.

$$\frac{\mu}{\mu_0} = 1 + 2.5\Phi + 10.05\Phi^2 + 0.00273 e^{16.6\Phi} \quad \text{(Equation 2)}$$

where μ is the viscosity of the filled system, $\mu_0$ the viscosity of the unfilled material $$\frac{\mu}{\mu_0}$$

the relative viscosity, and Φ the volume fraction of the filler.

Typical prepolymer specific gravity (SG) is about 1.05 g/cm³. With given SG of fluid-filled polymeric microspheres, we can easily predict viscosity increase of a preblend at different loading levels of fluid-filled polymeric microspheres by using Equation (3). The preblend viscosity will increase significantly with increasing loading of preexpanded polymeric microspheres. The results in Table 4 are for preexpanded polymeric microspheres. Expancel 551DE40d42. Expancel 551DE20d60, and Expancel 461DE20d70 all achieve numbers in excess of $$40\frac{\mu}{\mu_0},$$

at above 8 wt % of fluid-filled polymeric microspheres.

TABLE 4

| wt % polymeric microspheres | Relative viscosity of a filled system with | | |
|---|---|---|---|
| | 551DE40d42 | 551DE20d60 | 461DE20d70 |
| 0 | 1.0 | 1.0 | 1.0 |
| 1 | 2.0 | 1.6 | 1.5 |
| 2 | 3.7 | 2.6 | 2.3 |
| 3 | 7.8 | 4.0 | 3.3 |
| 4 | 18 | 6.8 | 5.1 |
| 5 | 40 | 12 | 8.2 |
| 6 | 80 | 23 | 14 |
| 7 | 146 | 40 | 23 |
| 8 | 244 | 67 | 39 |

At typical prepolymer processing temperature of 50 to 70° C., most commercial prepolymers without any filler have viscosity in the range of 1,000 to 5,000 cps, as shown in Table 5. There are numerous challenges in handling a preblend with viscosity significantly higher than 10.000 cps in casting process, including defects like flow patterns. Increasing preblend temperature to reduce viscosity is not feasible as the gel time can become too short to pour a cake. As a result, the maximum filler loading in a preblend is normally no more than 4 wt % for Expancel 461DE20d70 polymeric microspheres or 2.5 wt % for Expancel 551DE40d42 polymeric microspheres. At such filler loading levels, the relative viscosity of the preblend to the unfilled prepolymer is about 5. In other words, the viscosity of the preblend is about 5 times that of the unfilled prepolymer. Because of this limitation, the maximum volume porosity is typically less than 40% for a polishing pad with porosity generated by incorporating conventional preexpanded polymeric microspheres. This translates into significant challenges in making CMP polishing pads with SG lower than 0.70 using preexpanded polymeric microspheres.

TABLE 5

Typical viscosity of commercial prepolymers without any filler at various temperatures

| Prepolymer | % NCO range | Temperature (C.) | Typical viscosity (cps) |
|---|---|---|---|
| Adiprene L325 | 8.95-9.25 | 30 | 20,000 |
| | | 50 | 5000 |
| | | 70 | 1000 |
| Adiprene 750D | 8.75-9.05 | 30 | 10,500 |
| | | 60 | 1250 |
| Adiprene 600D | 7.1-7.4 | 30 | 6000 |
| | | 60 | 900 |
| Adiprene LFG963A | 5.55-5.85 | 30 | 15,000 |
| | | 50 | 3200 |
| | | 70 | 1000 |

To overcome viscosity limitations of a prepolymer containing greater than 4 to less than 8 wt % of polymeric microspheres, the present invention provides a method of making extra high porosity polishing pad with specific gravity values lower than 0.70 g/cm³ without significantly increasing the preblend viscosity.

Unexpanded polymeric microspheres occupy much less volume due to their high initial specific gravity values (close to that of a prepolymer). As a result, they fail to contribute much to the increase of preblend viscosity. These unexpanded polymeric microspheres can expand from heating including reaction exotherm of a polyurethane prepolymer reacting with a curative system. As a result, extra high porosity with pad specific gravity values lower than 0.70 g/cm³ can be made consistently without the limitation of high preblend viscosity.

Ex #1 and #2 had very uniform pore structure, as shown in FIGS. 4, 4A, 5 and 5A. Average pore size and standard deviation of Ex. #1, #2, and comparative Ex. #C1 are summarized in Table 6.

TABLE 6

| Polishing layer of | Average Pore Size (μm) | Standard deviation (μm) |
|---|---|---|
| Ex. #C1 | 41 | 13 |
| Ex. #1 | 25 | 10 |
| Ex. #2 | 24 | 10 |

Figure 7:
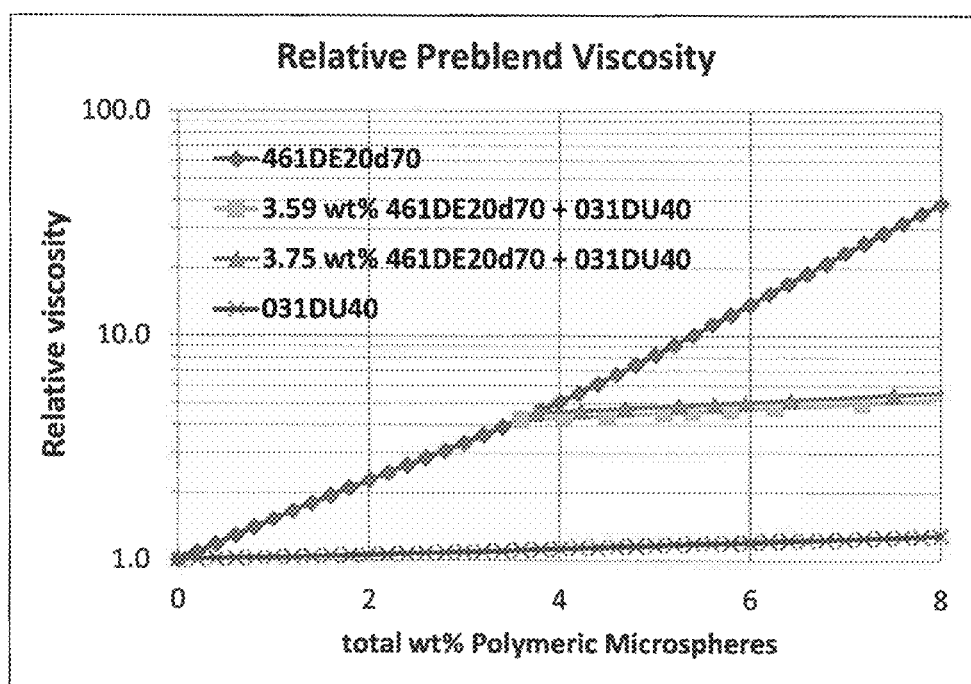
FIG. 7 is a plot of relative viscosity versus weight percent polymeric microspheres for preexpanded, unexpanded, and blends of preexpanded and unexpanded polymeric microspheres.

FIG. 7 shows relative viscosity comparison of a preblend containing different types of fluid-filled polymeric microspheres. There are two viable approaches to keep preblend viscosity in a reasonable range with above 4 to less than 8 wt % loading of fluid-filled polymeric microspheres. The first approach is to use only unexpanded polymeric microspheres, such as Expancel 031DU40 polymeric microspheres. The viscosity increase will be less than 50% at up to 8 wt % loading level. One alternative is to use a combination of preexpanded and unexpanded polymeric microspheres. The amount of preexpanded polymeric microspheres, such as Expancel 461DE20d70 polymeric microspheres, can be kept under 4 wt % to maintain reasonable preblend viscosity. With specific gravity values close to 1.0 g/cm³, unexpanded polymeric microspheres, such as Expancel 031DU40 polymeric microspheres, do not contribute much to preblend viscosity. At a total of 8 wt % loading of fluid-filled polymeric microspheres, over one order of magnitude reduction in preblend viscosity can be achieved by introducing unexpanded polymeric microspheres such as Expancel 031DU40.

Example 3

Fluid-filled polymeric microspheres, either preexpanded or unexpanded, can expand with increasing temperature. The degree of expansion depends on temperature, polymeric shell polymer composition, encapsulated liquid boiling point, and whether or not the polymeric microspheres are preexpanded or unexpanded. Thermomechanical analysis (TMA) provides an excellent tool for measuring expansion of various fluid-filled polymeric microspheres. The TMA method was carried out on the Thermal Mechanical Analyzer Q400 manufactured by TA Instruments. A ceramic cup with an inside diameter of 7.54 mm was placed on the sample platform of a TMA Q400. An aluminum lid having an outside diameter of 6.6 mm was placed inside the cup on the platform. A 6.1 mm diameter quartz expansion probe was lowered into the cup containing the lid with preload of 0.06 N downforce. Initial sample thickness was measured by the instrument and the resulting thickness was zeroed by the instrument. The sample cup and lid were then removed from the platform and the lid was removed from the cup. A small amount of fluid-filled polymeric microspheres was placed in the cup and then the lid was inserted into the cup. The cup and lid were placed back on the TMA platform and the quartz probe was lowered into the cup containing the sample and the lid. The thickness was measured again and recorded by the instrument. The TMA was then programmed for a temperature ramp from 30° C. to 250° C. with a ramp rate of 3° C./min and preload of 0.06 N.

The onset temperature of expansion ($T_{start}$), the maximum expansion, and the temperature at the maximum expansion ($T_{max}$) are summarized in Table 7 for a few selected fluid-filled polymeric microspheres. All polymeric microspheres expanded when heated up to above their $T_{start}$ temperature, including the preexpanded grades.

The reaction exotherm released when casting liquid polyurethane can easily bring the reaction mixture temperature to well above 100° C. before the material solidifies/gels, causing significant expansion of polymeric microspheres with proper thermomechanical properties.

TABLE 7

| Polymeric Microspheres | $T_{start}$ (° C.) | Maximum expansion | $T_{max}$ (° C.) |
|---|---|---|---|
| Expancel 551DE40d42 | 109 | 60% | 131 |
| Expancel 551DE20d60 | 103 | 40% | 126 |
| Expancel 461DE20d70 | 104 | 62% | 128 |
| Expancel 920DE40d30 | 122 | 14% | 155 |
| Expancel 920DE80d30 | 128 | 27% | 169 |
| Matsumoto F-65DE | 106 | 24% | 158 |
| Matsumoto PN-80SDE | 106 | 12% | 135 |
| Matsumoto FN-100SSDE | 109 | 17% | 156 |
| Matsumoto F-190DE | 155 | 29% | 189 |
| Matsumoto FN-100SSD | 137 | 940% | 159 |
| Matsumoto F-30D | 85 | 5445% | 122 |
| Matsumoto F-36D | 100 | 8300% | 138 |
| Matsumoto F-48D | 102 | 5297% | 137 |
| Expancel 031DU40 | 91 | 5235% | 117 |
| Expancel 461DU20 | 99 | 1966% | 129 |
| Expancel 930DU120 | 122 | 4989% | 174 |
| 1/8 wt ratio of Expancel 031DU40/Expancel 461DE20d70 | 91 | 96% | 128 |
| 1/4 wt ratio of Expancel 031DU40/Expancel 461DE20d70 | 90 | 145% | 116 |
| 1/2 wt ratio of Expancel 031DU40/Expancel 461DE20d170 | 90 | 282% | 116 |
| 1/1 wt ratio of Expancel 031DU40/Expancel 461DE20d70 | 90 | 308% | 120 |

The temperature of liquid polymer precursor at gel point, $T_{gel}$, needs to be higher than $T_{start}$ for expansion of fluid-filled polymeric microspheres to occur. Table 8 lists percent expansion at different temperatures of various polymeric microspheres. There are different approaches to control the $T_{gel}$, such as changing processing temperature or varying reaction exotherm by using a different % NCO prepolymer. Compared to 8.9% NCO for Adiprene LF750D and 9.1% NCO for Adiprene L325, Adiprene LFG963A has a lower % NCO at 5.7%. When Adiprene LFG963A was cured with MbOCA under the same conditions, the $T_{gel}$ was 105° C., much lower than the $T_{max}$ of Expancel 031DU40, but higher than its $T_{start}$ of 91° C. As a result, uniform pore structures were obtained without large bubbles over 100 μm present. At 105° C., Expancel 031DU40 can expand 24 times of its original volume, as shown in Table 8.

TABLE 8

| | % Expansion at temperature (° C.) | | | | |
|---|---|---|---|---|---|
| Polymeric Microspheres | 100 | 105 | 110 | 115 | 120 |
| Matsumoto F-190DE | 0% | 0% | 0% | 0% | 0% |
| Matsumoto FN-100SSD | 0% | 0% | 0% | 0% | 0% |
| Expancel 920DE40d30 | 0% | 0% | 0% | 0% | 0% |
| Expancel 920DE80d30 | 0% | 0% | 0% | 1% | 1% |
| Matsumoto F-65DE | 0% | 0% | 0% | 1% | 2% |
| Matsumoto FN-80SDE | 0% | 0% | 0% | 2% | 4% |
| Matsumoto FN-100SSDE | 0% | 0% | 1% | 2% | 3% |
| Expancel 551DE40d42 | 0% | 1% | 3% | 8% | 16% |
| Expancel 551DE20d60 | 1% | 3% | 7% | 14% | 27% |
| Expancel 461DE20d70 | 0% | 1% | 9% | 22% | 38% |
| Expancel 930DU120 | 0% | 0% | 0% | 0% | 57% |
| Matsumoto F-30D | 2670% | 3450% | 4230% | 4990% | 5360% |
| Matsumoto F-36D | 200% | 1700% | 3820% | 4490% | 5010% |
| Matsumoto F-48D | 0% | 1060% | 2500% | 2900% | 3230% |
| 1/8 wt ratio of Expancel 031DU40/Expancel 461DE20d70 | 31% | 36% | 46% | 75% | 84% |
| 1/4 wt ratio of Expancel 031DU40/Expancel 461DE20d70 | 67% | 78% | 97% | 140% | 136% |
| 1/2 wt ratio of Expancel 031DU40/Expancel 461DE20d70 | 113% | 127% | 154% | 276% | 239% |
| 1/1 wt ratio of Expancel 031DU40/Expancel 461DE20d70 | 155% | 178% | 205% | 274% | 307% |
| Expancel 461DU20 | 108% | 393% | 901% | 1323% | 1666% |
| Expancel 031DU40 | 2130% | 2421% | 2771% | 4359% | 4693% |

When $T_{gel}$ of the liquid polymer precursor was higher than $T_{max}$ of fluid-filled polymeric microspheres, gas entrapped inside the polymeric microspheres diffused out of the shell of polymeric microspheres into polyurethane matrix, causing non-uniform and large pore size in the polishing pad, negatively affecting polishing performance.

The invention provides polishing pads with excellent conditioner stability. This conditioner stability can improve pad life. In addition, the blend of preexpanded and unexpanded polymeric microspheres allows for casting of low density polishing pads not possible by conventional casting techniques. Finally, using a blend of preexpanded and unexpanded polymeric microspheres can create an ideal combination of viscosity for castability and exothermic heat to achieve effective pore diameters for enhanced polishing.

The invention claimed is:
1. A method of manufacturing a polishing pad suitable for planarizing at least one of semiconductor, optical and magnetic substrates, the method comprising the following:
obtaining a liquid polyurethane material formed from an isocyanate-terminated molecule and a curative agent, the liquid polyurethane material having a $T_{gel}$ temperature and containing fluid-filled polymeric microspheres, the fluid-filled polymeric microspheres are a blend of preexpanded and unexpanded fluid-filled polymeric microspheres, the preexpanded and unexpanded fluid-filled polymeric microspheres each having a $T_{start}$ temperature where diameter of the preexpanded and unexpanded fluid-filled polymeric microspheres increases at temperatures equal to or above the $T_{start}$ temperature, and a $T_{max}$ temperature where gas escapes through the preexpanded and unexpanded fluid-filled polymeric microspheres to decrease diameter of the expanded and unexpanded fluid-filled polymeric microspheres, with the $T_{start}$ temperature of the unex- panded fluid-filled polymeric microspheres being at least 5° C. less than the $T_{gel}$ temperature of the liquid polyurethane material;

casting the liquid polyurethane material containing the blend of preexpanded and unexpanded fluid-filled polymeric microspheres to react the isocyanate-terminated molecule and the curative agent;

heating the blend of preexpanded and unexpanded fluid-filled polymeric microspheres in the liquid polyurethane material to a temperature of at least $T_{start}$ of the unexpanded fluid-filled polymeric microspheres to increase the diameter of the unexpanded fluid-filled polymeric microspheres, the heating being to a temperature less than the $T_{max}$ temperature where gas escapes through the preexpanded and unexpanded fluid-filled polymeric microspheres, the heating being to form a blend of preexpanded and expanded fluid-filled polymeric microspheres in the liquid polyurethane material;

curing the blend of preexpanded and expanded fluid-filled polymeric microspheres in the liquid polyurethane material to solidify the liquid polyurethane material into a polyurethane matrix containing the preexpanded and expanded fluid-filled polymeric microspheres; and finishing the polishing pad from the cured polyurethane matrix containing the preexpanded and expanded fluid-filled polymeric microspheres wherein final diameter of the preexpanded and expanded fluid-filled polymeric microspheres is less than that achieved from the $T_{max}$ temperature in air and a majority of fluid contained in the preexpanded and unexpanded fluid-filled polymeric microspheres remains in the preexpanded and expanded fluid-filled polymeric microspheres.

2. The method of claim 1 including the additional step of mixing the blend of preexpanded and unexpanded fluid-filled polymeric microspheres in the liquid polyurethane material before casting.

3. The method of claim 1 wherein the $T_{start}$ temperature of the unexpanded fluid-filled polymeric microspheres is at least 10° C. less than the $T_{gel}$ temperature of the liquid polyurethane material.

4. The method of claim 1 wherein the casting is into a cake mold to form a polyurethane cake structure; and including the additional steps of removing the polyurethane cake structure from the mold and skiving the cake structure into multiple polyurethane sheets; and the forming the polishing pads is from the polyurethane sheets.

5. The method of claim 1 wherein the casting includes pouring the liquid polyurethane material and the blend of preexpanded and expanded fluid-filled polymeric microspheres around a transparent block and the forming the polishing pad includes a transparent window in the polishing pad.

6. A method of manufacturing a polishing pad suitable for planarizing at least one of semiconductor, optical and magnetic substrates, the method comprising the following:

obtaining a liquid polyurethane material formed from an isocyanate-terminated molecule and a curative agent, the liquid polyurethane material having a $T_{gel}$ temperature and containing fluid-filled polymeric microspheres, the fluid-filled polymeric microspheres are a blend of preexpanded and unexpanded fluid-filled polymeric microspheres filled with isobutane, isopentane or a mixture of isobutane and isopentane, the preexpanded and unexpanded fluid-filled polymeric microspheres each having a $T_{start}$ temperature where diameter of the preexpanded and unexpanded fluid-filled polymeric microspheres increases at temperatures equal to or above the $T_{start}$ temperature, and a $T_{max}$ temperature where gas escapes through the preexpanded and unexpanded fluid-filled polymeric microspheres to decrease diameter of the expanded and unexpanded fluid-filled polymeric microspheres, with the $T_{start}$ temperature of the unexpanded fluid-filled polymeric microspheres being at least 5° C. less than the $T_{gel}$ temperature of the liquid polyurethane material;

casting the liquid polyurethane material containing the blend of preexpanded and unexpanded fluid-filled polymeric microspheres to react the isocyanate-terminated molecule and the curative agent;

heating the blend of preexpanded and unexpanded fluid-filled polymeric microspheres in the liquid polyurethane material to a temperature of at least $T_{start}$ of the unexpanded fluid-filled polymeric microspheres to increase the diameter of the unexpanded fluid-filled polymeric microspheres, the heating being to a temperature less than the $T_{max}$ temperature where gas escapes through the preexpanded and unexpanded fluid-filled polymeric microspheres, the heating being to form a blend of preexpanded and expanded fluid-filled polymeric microspheres in the liquid polyurethane material;

curing the blend of preexpanded and expanded fluid-filled polymeric microspheres in the liquid polyurethane material to solidify the liquid polyurethane material into a polyurethane matrix containing the preexpanded and expanded fluid-filled polymeric microspheres; and finishing the polishing pad from the cured polyurethane matrix containing the preexpanded and expanded fluid-filled polymeric microspheres wherein final diameter of the preexpanded and expanded fluid-filled polymeric microspheres is less than that achieved from the $T_{max}$ temperature in air and a majority of fluid contained in the preexpanded and unexpanded fluid-filled polymeric microspheres remains in the preexpanded and expanded fluid-filled polymeric microspheres.

7. The method of claim 6 including the additional step of mixing the blend of preexpanded and unexpanded fluid-filled polymeric microspheres in the liquid polyurethane material before casting.

8. The method of claim 6 wherein with the $T_{start}$ temperature of the unexpanded fluid-filled polymeric microspheres is at least 10° C. less than the $T_{gel}$ temperature of the liquid polyurethane material.

9. The method of claim 6 wherein the casting is into a cake mold to form a polyurethane cake structure; and including the additional steps of removing the polyurethane cake structure from the mold and skiving the cake structure into multiple polyurethane sheets; and the forming the polishing pads is from the polyurethane sheets.

10. The method of claim 6 wherein the casting includes pouring the liquid polyurethane material and the blend of preexpanded and expanded fluid-filled polymeric microspheres around a transparent block and the forming the polishing pad includes a transparent window in the polishing pad.

* * * * *